United States Patent [19]
McClure

[11] Patent Number: 6,072,732
[45] Date of Patent: Jun. 6, 2000

[54] SELF-TIMED WRITE RESET PULSE GENERATION

[75] Inventor: David C. McClure, Carrollton, Tex.

[73] Assignee: STMicroelectronics, Inc., Carrollton, Tex.

[21] Appl. No.: 09/183,444

[22] Filed: Oct. 30, 1998

[51] Int. Cl.[7] .................................................. G11C 7/00
[52] U.S. Cl. ...................... 365/191; 365/189.01; 365/190
[58] Field of Search ...................... 365/190, 191, 365/194, 225.7, 189.01

[56] References Cited

U.S. PATENT DOCUMENTS

| | | | |
|---|---|---|---|
| 5,010,519 | 4/1991 | Yoshimoto et al. | 365/149 |
| 5,018,111 | 5/1991 | Madland | 365/233 |
| 5,655,105 | 8/1997 | McLaury | 365/194 |
| 5,724,292 | 3/1998 | Wada | 365/207 |
| 5,808,960 | 9/1998 | McClure | 365/233 |

*Primary Examiner*—Son Mai
*Attorney, Agent, or Firm*—Theodore E. Galanthay; Lisa K. Jorgenson; Andre Szuwalski

[57] ABSTRACT

A memory, such as a static random access memory (SRAM), includes at least one memory cell. The bit lines for that memory cell are selectively connected to corresponding write bit lines through a column select pass transistor and a selectively blowable fuse. A reset circuit is connected to the same write bit lines through a fuse structure mimic circuit. Responsive to data transitions on the write bit lines, the reset circuit operates to detect the occurrence of a memory operation to the memory cell and generate a reset signal for resetting the memory in preparation for a next write operation. To support substantially simultaneous presentation of write data to both the reset circuit and the memory cell, the fuse structure mimic circuit delays presentation of the write bit line data to the reset circuit. This introduced delay substantially corresponds to a delay in the presentation of the write bit line data to the memory cell resulting from driving the memory cell bit lines through the selectively blowable fuses.

24 Claims, 4 Drawing Sheets

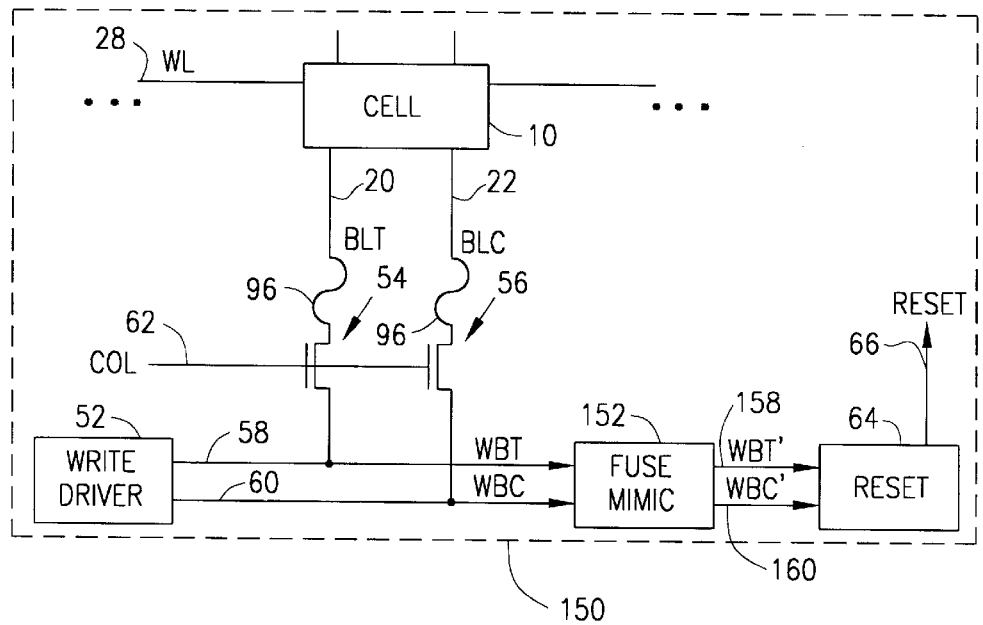
FIG. 4
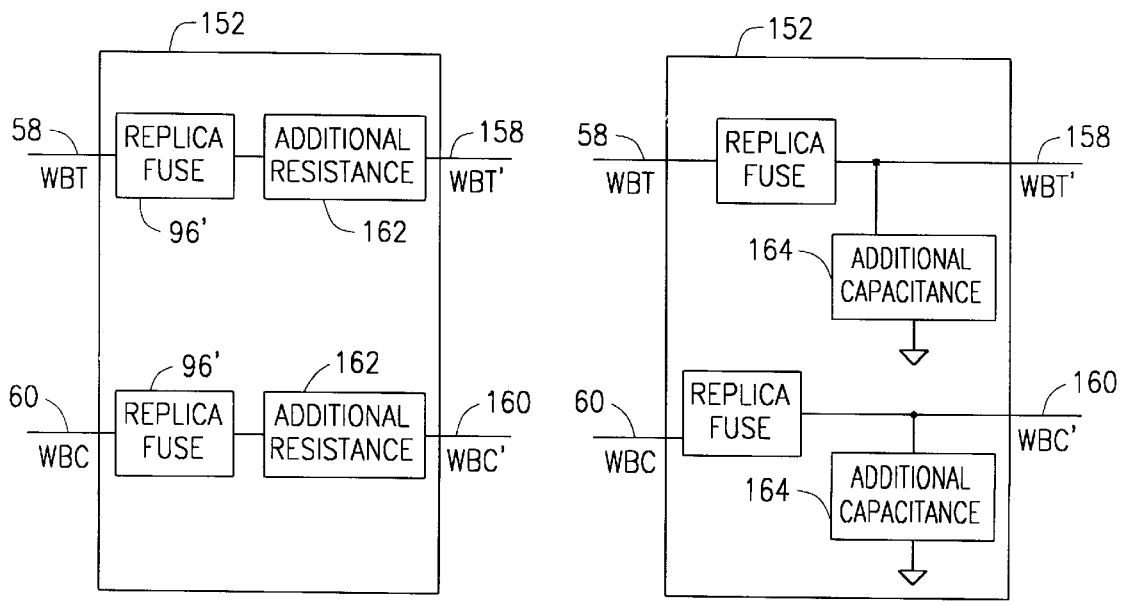
FIG. 5A
FIG. 5B

SELF-TIMED WRITE RESET PULSE GENERATION

CROSS REFERENCE TO RELATED APPLICATIONS

The present invention is related to co-pending, commonly assigned, U.S. application for patent Ser. No. 08/858,295, now U.S. Pat. No. 5,808,960, entitled "Circuit and Method for Tracking the Start of a Write to a Memory Cell" (Attorney Docket No. 95-C-148), and to co-pending, commonly assigned, U.S. application for patent Ser. No. 08/858,788, now U.S. Pat. No. 5,825,691, entitled "Circuit and Method for Terminating a Write to a Memory Cell" (Attorney Docket No. 95-C-149). The disclosures of the foregoing applications are incorporated by reference in this application for patent.

BACKGROUND OF THE INVENTION

1. Technical Field of the Invention

The present invention relates to writing data into a memory and, in particular, to controlling the generation of a self-timed write reset pulse which instructs the memory to reset itself in preparation for a next write operation.

2. Description of Related Art

Reference is now made to FIG. 1 wherein there is shown a circuit diagram of a prior art memory cell 10 suitable for placement within a memory array (not shown). The memory cell 10 as illustrated comprises a four transistor static memory cell such as that commonly used in a static random access memory (SRAM) type of memory array. The memory cell 10 includes two gate/drain cross-coupled transistors 12 and 14, along with two access transistors 16 and 18. A first bit line (bit line true—BLT) 20 is connected to one of the access transistors 16. A second bit line (bit line complement—BVC) 22 is connected to the other of the access transistors 18. At nodes 30 and 32, the drains 12d and 14d of the cross-coupled transistors 12 and 14 are connected to their respective access transistors 16 and 18, and are also connected to a voltage supply (Vcc) through a pair of poly resistors 24 and 26, respectively. The gates 16g and 18g of the access transistors 16 and 18 are connected to a word line (WL) 28. Data is stored by the memory cell 10 at the nodes 30 and 32 (with the data at node 30 being the true data, and the data at node 32 being the complement data). During a read or write operation, bit line 20 and 22 access to the nodes 30 and 32, respectively, is provided by driving the word line 28 high, and thus turning on the access transistors 16 and 18.

Reference is now made to FIG. 2 wherein there is shown a block diagram of a portion of a prior art memory 50. The memory 50 includes a plurality of a memory cells 10 (only one shown for simplification) arranged in an array configuration. A write driver 52 circuit is connected to the bit lines 20 and 22 of the memory cell 10 through a pair of pass transistors 54 and 56 as well as fuses 96. More particularly, a first write bit line (write bit true—WBT) 58 output from the write driver is connected through pass transistor 54 to the bit line true 20. A second write bit line (write bit complement—WBC) 60 is connected through pass transistor 56 to the bit line complement 22. A column select line (COL) 62 is connected to the gates of the pass transistors 54 and 56 and is driven high when selecting the column comprising bit line true 20 and bit line complement 22 for connection to the write bit lines 58 and 60. During the write operation, write driver 52 access to the bit lines 20 and 22 is provided by driving the column select line 62 high. This action turns on the pass transistors 54 and 56 and gives the write driver access to the memory cell 10.

A reset circuit 64 receives the write bit true line 58 and write bit complement line 60 data output from the write driver 52 with each write operation. The reset circuit 64 senses a start of the write operation from detected logic level transitions on either the write bit true line 58 or the write bit complement line 60 at the start of a write operation. The reset circuit 64 then waits for a predetermined amount of time sufficient to allow for completion of the writing of data into the memory cell 10. At that point in time, a reset signal (RESET) 66 pulse is generated. This reset signal 66 is applied to a number of circuits (not shown) within the memory 50 associated with addressing and accessing the memory cell 10. Upon receipt of the reset signal 66, addressing and accessing operations are immediately terminated. Receipt of the reset signal 66 further causes these circuits to reset themselves in preparation for the start of a next write operation.

Reference is now made to FIG. 3 wherein there is shown a circuit diagram for a prior art reset circuit 64. The reset circuit 64 includes a write sensing circuit 68 that operates to detect logic level transitions on the write bit true line 58 and write bit complement line 60 at the start of a write operation. Responsive thereto, write simulation logic 70 simulates the writing of data into the memory cell 10 by flipping the stored data state of a dummy memory cell 10'. A write complete signal in then output from the write simulation logic following completion of the dummy memory write operation. A delay circuit 72 delays passage of the write complete signal for a period of time sufficient to ensure that the write operation has been completed, and then generates the reset signal 66 for output from the reset circuit 64.

The write sensing circuit 68 comprises a NAND gate 74 that receives write bit true line 58 and write bit complement line 60 data output from the write driver 52 at its input. The write simulation logic 70 includes a dummy memory cell 10' comprising a pair of gate/drain cross-coupled memory transistors 12' and 14' and a pair of gate/drain cross-coupled transistors 76 and 78 functioning as an access transistor 16' for the memory cell. The write simulation logic 70 also receives write bit true line 58 and write bit complement line 60 data output from the write driver 52 as inputs. More specifically, the write bit true line 58 is connected to the drain of transistor 76 and to the gate of transistor 78. The write bit complement line 60, on the other hand, is connected to the drain of transistor 78 and to the gate of transistor 76. The sources of transistors 76 and 78 are connected together at node 80. The write simulation logic 70 still further includes a p-channel pull-up transistor 82 and an access transistor 18'. The output of the NAND gate 74 for the write sensing circuit 68 is connected to the gate of pullup transistor 82 and to the source of access transistor 18'. Node 80 is connected to the drain of pull-up transistor 82 and also to the drain of transistor 12' and the gate of transistor 14'. The drain of access transistor 18' at node 84 is connected to the drain of transistor 14' and the gate of transistor 12'. The write simulation logic further comprises a pair of stacked transistors 86 and 88 which are source/drain connected at node 90 to the delay circuit 72. In this configuration, an upper one 86 of the stacked transistors comprises a p-channel device, and a lower one 88 of the stacked transistors comprises an n-channel device. The output of the NAND gate 74 is further connected to the gate of an upper one 86 of the stacked transistors. Node 84 from the dummy memory cell 10' is connected to the gate of a lower one 88 of the stacked transistors.

The cross-coupled transistors 76 and 78 forming the access transistor 16' of the dummy memory cell 10' are sized to replicate and designed to simulate operation of the access transistor 16 for the memory cell 10 of FIG. 1. The access transistor 18' of the dummy memory cell 10' is sized to replicate and designed to simulate operation of the access transistor 18 for the memory cell 10 of FIG. 1. Furthermore, the cross-coupled transistors 12' and 14' of the dummy memory cell 10' are sized to replicate and designed to simulate operation of cross coupled transistors 12 and 14 for the memory cell 10 of FIG. 1. All interconnections between the various circuit components of the dummy memory cell 10' are identical to that presented with the memory cell 10. Thus, although operational characteristics of memory devices may vary from lot to lot, because the memory cell 10 and the dummy memory cell 10' are manufactured on the same die using the same mask exposure and process, the memory cell and dummy memory cell exhibit virtually identical timing and operational performance characteristics. As will be discussed in more detail below, this feature is advantageously utilized in connection with the timely generation of the reset signal 66.

Reference is now made in combination to FIGS. 2 and 3. In preparation for writing data into the memory cell 10, the write bit true line 58 and the write bit complement line 60 are both at logic level high, thus driving the output of the NAND gate 74 to a normally logic level low. This turns on p-channel pull-up transistor 82 to drive node 80 of the dummy memory cell 10' high. This normally logic level low output of NAND gate 74 is further passed through access transistor 18' to node 84, with node 84 also being driven to logic level low due to the turning on of transistor 14'. The high and low, respectively, logic levels of nodes 80 and 84 remain the same at all times during circuit operation except when the write operation itself is being performed.

The output of NAND gate 74 remains at normally logic level low for so long as the write bit true line 58 and write bit complement line 60 both maintain a logic level high indicative of an operational state wherein data is not being written into the memory. Thus, a logic level low output from the NAND gate 74 is applied to the gate of upper stacked p-channel transistor 86, and a logic level low output from node 84 is applied to the gate of the lower stacked transistor 88. This combined logic level low signal application turns on transistor 86 and turns off transistor 88 producing a logic level high output at node 90 which is passed through the delay circuit 72 and output (following an inversion) as the reset signal 66 (at logic level low).

When a write operation is being performed, the write driver 52 receives the data to be written into the memory. Previous to that, the address for the individual memory cell 10 within the memory has been presented and that cell has been selected. The true and complement values of the data to be written are then output on the write bit true line 58 and write bit complement line 60, respectively, and are presented to bit line true and bit line complement 20 and 22, respectively, through the column selected 62 transistors 54 and 56, respectively. Simultaneously, the true and complement values of the data to be written are presented to the NAND gate 74 of the write sensing circuit 68. At this point, one of the write bit lines 58 or 60 goes to a logic level low causing the output of the NAND gate 74 to switch to a logic level high. The occurrence of a write operation is accordingly detected by the write sensing circuit 68, and a signal indicative of this write operation is output from the NAND gate 74 to the write simulation logic 70.

When the NAND gate 74 output goes to logic level high, pull-up transistor 82 of the write simulation logic 70 is turned off. At the same time, one of the access transistor 16' related cross-coupled transistors 76 or 78 is turned off because the corresponding write bit line 58 or 60 connected to its gate has made a transition to logic level low. The remaining one of the cross-coupled transistors 78 or 76 remains on to pass the logic level low signal on one of the low going write bit lines 58 or 60 through to node 80. When this low going signal is applied to the gate of transistor 14', it turns off and node 84 is no longer connected to ground (Vss). With the output of the NAND gate 74 going to logic level high, a logic level high signal is passed through access transistor 18' to node 84, thus driving it also to logic level high. Taking node 84 to a logic level high causes transistor 12' to turn on and pull node 80 to ground (if this has not yet already occurred from the operation of the access transistor 16'). This results in a flipping of the dummy memory cell 10' stored data at nodes 80 and 84 and thus simulate the occurrence of the actual write operation which is simultaneously occurring in the memory cell 10. A logic level high output from the NAND gate 74 is further applied to the gate of upper stacked p-channel transistor 86, and a logic level high output from node 84 of the dummy memory cell 10' is applied to the gate of the lower stacked transistor 88. These simultaneous logic level high signal applications turn off transistor 86 and turn on transistor 88 producing a logic level low output at node 90 (the write complete signal) which is passed through the inverting delay circuit 72 and output as the reset signal 66 pulse (at logic level high). Responsive to the logic level high pulsing of the reset signal 66, operations of the addressing and accessing circuits (not shown) within the memory are immediately terminated. These addressing and accessing circuits are further reset by the pulsed signal in preparation for the start of a next write operation. The reset pulse output from the reset circuit 64 accordingly provides for an internal, self-timed termination of the memory write operation.

Following termination of the write operation and resetting of the addressing and accessing circuits, the write bit true line 58 and the write bit complement line 60 are both returned to logic level high. This drives the output of NAND gate 74 back to normally logic level low, which turns on p-channel pull-up transistor 82 and brings node 80 into a logic level high state. The logic level low output of NAND gate 74 is further passed through access transistor 18' to node 84, with node 84 also being driven to logic level low due to the turning on of transistor 14'. Thus nodes 80 and 84 are now returned to their normal high and low logic levels, respectively, in preparation for next operation to write data into the memory cell 10. A logic level low output from the NAND gate 74 is thus applied to the gate of upper stacked p-channel transistor 86, and a logic level low output from node 84 is applied to the gate of the lower stacked transistor 88. This dual logic level low signal application turns on transistor 86 and turns off transistor 88 producing a logic level high output at node 90 which is passed through the delay circuit 72 to return the reset signal 66 to a logic level low state (ending generation of the reset pulse).

When the write data is output from the write driver 52 to the memory, it passes through transistors 54 and 56 before presentation to the bit lines 20 and 22, respectively. At the same time, the write data is presented to NAND gate 74 and to cross-coupled transistors 76 and 78 which are designed to simulate the timing required for the write data to be presented to the memory cell 10 in the memory itself so that node 84 of the dummy memory cell 10' and node 32 of the memory cell 10 are presented with the data at substantially the same time. Since the structural and operational characteristics of the access transistors and the cross coupled transistors of the memory cell 10 and the dummy memory cell 10' (of the reset circuit 64) are identical to each other, the time required to change the state of the transistor in the memory cell 10 (i.e., effectuate a write) is substantially identical to the time required to change the state of the data in the dummy memory cell 10'. Thus, the generation of the write complete signal (i.e., node 90 going to a high logic level) by the reset circuit 64 following a change of data state at dummy memory cell 10' node 84 substantially corresponds with completion of the write operation in the memory cell 10. The resulting reset signal 66 is thus correctly timed to cause write termination after a sufficient amount of time to ensure that the write operation in the memory cell 10 is completed but also as quickly and efficiently as possible so as to promptly reset the memory for a next write operation.

It is imperative to accurate operation of the reset circuit 64 that the write data output from the write driver 52 be simultaneously presented to both the memory 10 and to the reset circuit 64. However, in certain memory design implementations elements are added to the memory design between the write driver 52 and the memory cell 10 which may alter timing and skew simultaneous write data presentation to the memory cell 10 and reset circuit 94. For example, a selectively blowable polysilicon fuse 96 may be fabricated and positioned between the pass transistor 54 and 56 the memory cell 10 along the bit lines 20 and 22, respectively. As is well known in the art, these fuses 96 are selectively blown in instances where it becomes necessary (perhaps due to an inherent defect) to disconnect a column and permanently isolate the memory cell 10 from the write bit lines 58 and 60. A drawback of the use of these fuses is that during a write operation the write driver 52 must drive the bit lines 20 and 22 through the fuses 96. As these fuses 96 can exhibit a resistance of approximately 300–1000 ohms, and the bit lines 20 and 22 exhibit a relatively high capacitance, the resulting RC circuit (with its inherent time constant $\tau$) can introduce a significant delay time in the action for driving the bit lines and completing the write operation in the memory cell 10. Absent some ability to compensate for this memory cell introduced delay time, there is a risk that the write data output from the write driver 52 will not be simultaneously presented to both the memory 10 and to the reset circuit 94. If this occurs, the reset circuit 64 may generate the reset signal 66 before the write operation is completed thus jeopardizing the efficacy of the write operation and the accuracy of the data stored in the memory cell 10.

There is accordingly a need to account for circuit element introduced delays within the memory and ensure substantially simultaneous presentation of the write data output from the write driver 52 to both the memory 10 and to the reset circuit 94.

SUMMARY OF THE INVENTION

The present invention comprises a memory including a memory cell having its bit lines selectively connected to corresponding write bit lines through a selectively blowable fuse, such as a selectively blowable polysilicon fuse. The memory further includes a reset circuit connected to the write bit lines through a fuse structure mimic circuit. The reset circuit operates to detect the occurrence of a write operation to the memory cell from data transitions on the write bit lines, and in response thereto generate a reset signal for resetting the memory in preparation for a next write operation. The fuse structure mimic circuit introduces a delaying effect on write bit line data passage prior to processing by the reset circuit. The reset circuit related delaying effect substantially corresponds to a delaying effect on write bit line data passage which results from driving the memory cell bit lines through the selectively blowable polysilicon fuses. As a result, write bit line data are substantially simultaneously presented to both the reset circuit and the memory cell, thus allowing for the accurate and timely generation of the reset signal.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 4 a block diagram of portion of a memory in accordance with the present invention;

FIGS. 5A and 5B are circuit diagrams for a fuse structure mimic circuit utilized in the memory of FIG. 4.

DETAILED DESCRIPTION OF THE DRAWINGS

Figure 1:
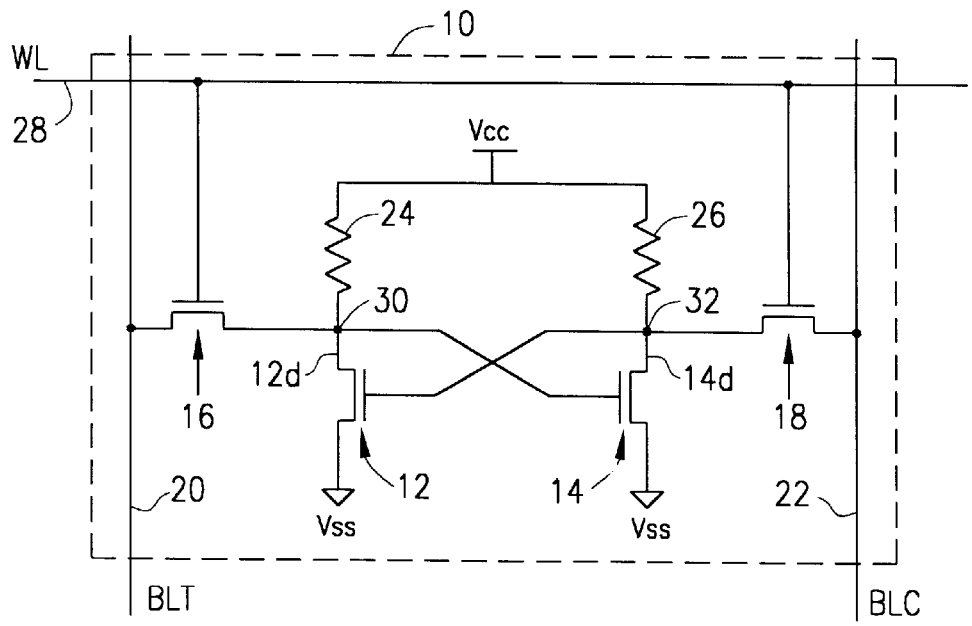
FIG. 1 (previously described) is a circuit diagram of a prior art memory cell suitable for placement within a memory array.
Figure 2:
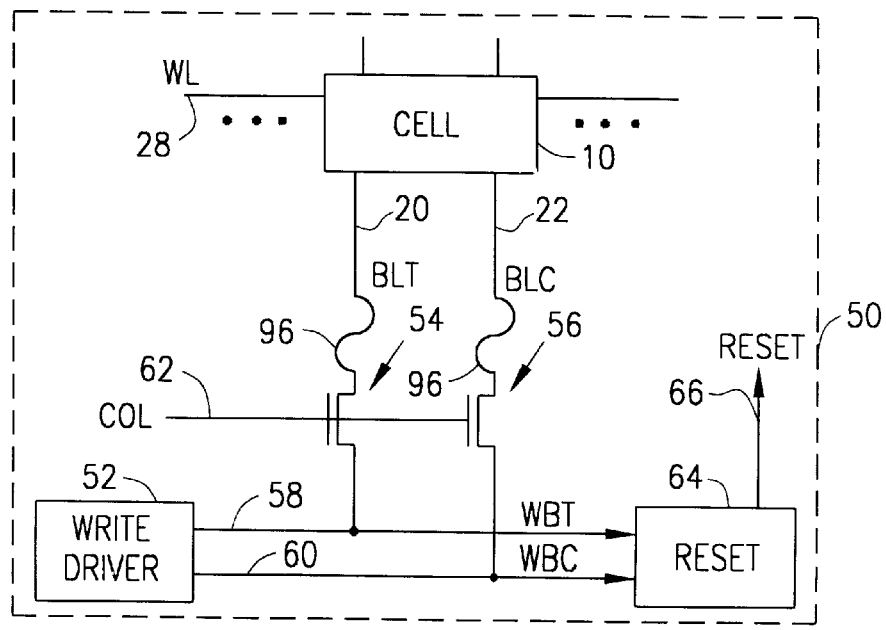
FIG. 2 (previously described) is a block diagram of portion of a prior art memory incorporating the memory cell of FIG. 1.

Reference is now made to FIG. 4 wherein there is shown a block diagram of a portion of a memory 150 in accordance with the present invention. The memory 150 includes a plurality of a memory cells 10 (only one shown for simplification) arranged in an array configuration. A write driver 52 circuit is connected to the bit lines 20 and 22 of the memory cell 10 through a pair of column pass transistors 54 and 56, respectively, and fuses 96. Fuses 96 may be polysilicon fuses or fuses made of other compositions. More particularly, a first write bit line (write bit true—WBT) 58 output from the write driver is connected through pass transistor 54 and polysilicon fuse 96 to the bit line true 20. A second write bit line (write bit complement—WBC) 60 is connected through pass transistor 56 and polysilicon fuse 96 to the bit line complement 22. A column select line (COL) 62 is connected to the gates of the pass transistors 54 and 56 for selecting the column comprising bit line true 20 and bit line complement 22 for connection to the write bit lines 58 and 60. During write operation, write driver 52 access to the bit lines 20 and 22 is provided by driving the column select line 62 high, and thus turning on the pass transistors 54 and 56 and giving the write driver access through the polysilicon fuses 96 to the memory cell 10.

A fuse structure mimic circuit 152 receives the write bit true line 58 and the write bit complement line 60 data output from the write driver 52 with each write operation. The fuse structure mimic circuit 152 is designed to mimic, with respect to the write driver 52 output data as applied to the reset circuit 64, the same delaying effect introduced by the fuses 96 concerning the passage of that same data output from the write driver and applied through the fuses and bit line true 20 and bit line complement 22 to the memory cell 10. As a result, time modified write bit true line (WBT') 158 and write bit complement line (WBC') 160 data are output from the fuse structure mimic circuit 152 with a delay substantially identical to the fuse 96 introduced bit line 20 and 22 delay.

A reset circuit 64 (see, FIG. 3 and description above) receives the time modified write bit true line 158 and the write bit complement line 160 data output from the fuse structure mimic circuit 152 with each write operation. The reset circuit 64 senses a start of the write operation from detected logic level transitions of the data carried by the time modified write bit true line 158 or write bit complement line 160 at the start of a write operation, and then waits for a predetermined amount of time sufficient to complete writing into the memory cell 10. At that point in time, a reset signal (RESET) 66 is generated. This reset signal 66 is applied to a number of circuits (not shown) within the memory 50 associated with addressing and accessing the memory cell 10. Upon receipt of the reset signal 66, addressing and accessing operations are immediately terminated. Receipt of the reset signal 66 further causes these circuits to reset themselves in preparation for the start of a next write operation.

Figure 3:
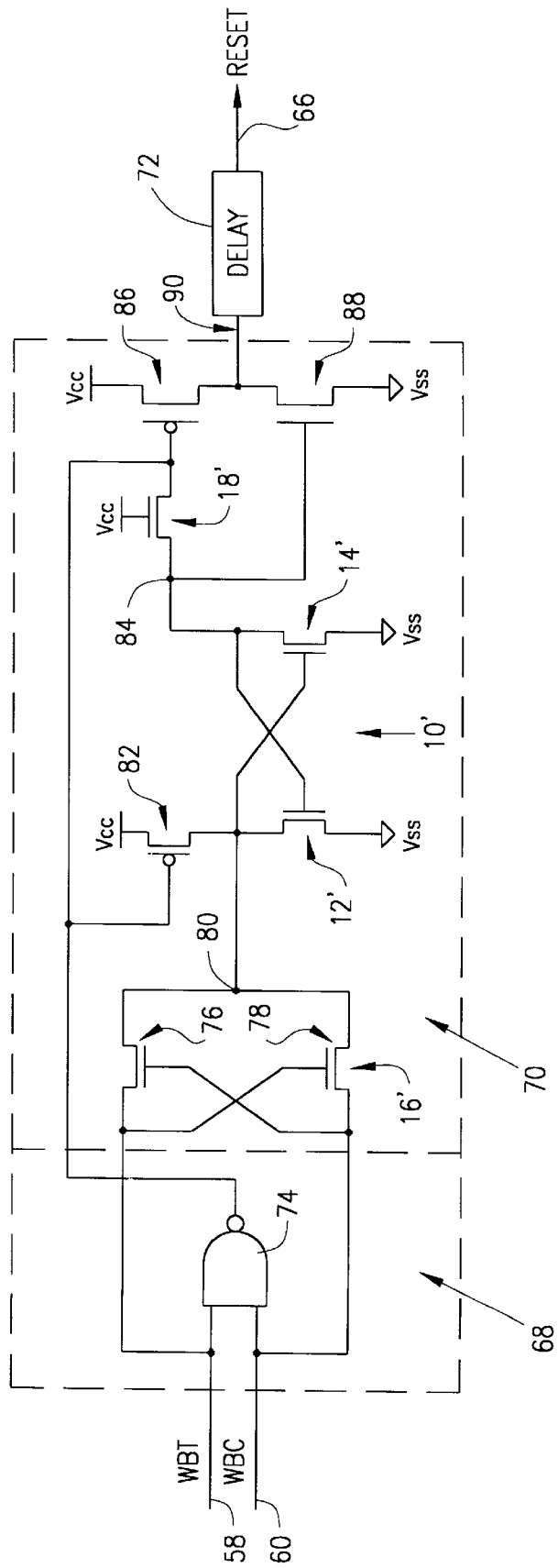
FIG. 3 (previously described) is a circuit diagram for a prior art reset circuit.

Additional reference is now made to FIG. 3. When the write data is output from the write driver 52 to the memory, it passes through transistors 54 and 56 and fuses 96 before presentation to the bit lines 20 and 22, respectively, and the memory cell 10. At the same time, the write data passes through the fuse structure mimic circuit 152 and is presented to NAND gate 74 and to cross-coupled transistors 76 and 78 of the reset circuit 64. The fuse structure mimic circuit 152, NAND gate 74 and cross-coupled transistors 76 and 78 are designed to simulate the timing required for the write data to be presented to the memory cell 10 in the memory itself so that node 84 of the dummy memory cell 10' and node 32 of the memory cell 10 are presented with the data at substantially the same time. Since the structural and operational characteristics of the access transistors and the cross coupled transistors of the memory cell 10 and the dummy memory cell 10' (of the reset circuit 64) are identical to each other, the time required to change the state of the transistor in the memory cell 10 (i.e., effectuate a write) is substantially identical to the time required to change the state of the data in the dummy memory cell 10'. Thus, the generation of the write complete signal (i.e., node 90 going to a low logic level) by the reset circuit 64 following a change of data state at dummy memory cell 10' node 84 corresponds generally with completion of the write operation in the memory cell 10. The resulting delayed reset signal 66 (high pulse) is thus correctly timed to cause write termination after a sufficient amount of time to ensure that the write operation in the memory cell 10 is completed but also as quickly and efficiently as possible so as to promptly reset the memory for a next write operation.

Reference is now made to FIGS. 5A and 5B wherein there are shown circuit diagrams for the fuse structure mimic circuit 152 utilized in the memory of FIG. 4. In general, the fuse structure mimic circuit 152 operates to mimic the resistance of the fuses 96. Accordingly, it can comprise a replica 96' of the fuse 96 for the memory cell 10 bit lines 20 and 22, fabricated to interconnect the write bit true 58 and write bit complement 60 with the modified write bit true 158 and write bit complement 160, respectively. Although operational characteristics of fuses may vary from lot to lot, because the fuse 96 and the replica 96' are manufactured on the same die using the same mask exposure and process, the fuse and its replica exhibit virtually identical timing and operational performance characteristics. However, it is recognized that the bit lines 20 and 22 may have a different (i.e., perhaps much greater) capacitance than the modified write bit true line 158 and write bit complement line 160. In order then to replicate substantially the same RC time constant as provided by the fuses 96 and bit lines 20 and 22, the fuse structure mimic circuit 152 must either include more resistance or additional capacitance. FIG. 5A illustrates the more resistance option for the fuse structure mimic circuit 152 in that it includes, in addition to a replica fuse 96' connected in series between the write bit lines 58 and 60 and the modified write bit lines 158 and 160, respectively, more resistance 162 connected in series with the replica fuse. As an example, the additional resistance 162 may comprise one or more additional series connected replica fuses 96'. FIG. 5B, on the other hand, illustrates the additional capacitance option for the fuse structure mimic circuit 152 in that it includes, in addition to a replica fuse 96' connected in series between the write bit lines 58 and 60 and the modified write bit lines 158 and 160, respectively, an additional capacitance 164 shunt connected between the replica fuse and ground. As an example, the additional capacitance 164 may comprise a metal oxide semiconductor (MOS) capacitor or diffusion capacitor. Thus, where the timing of driving the memory cell bit lines 20 and 22 is affected by a first RC time constant $\tau 1$ equal to the product of the fuse 96 resistance (R1) and the memory cell bit line 20 or 22 capacitance (C1), the timing of driving the reset circuit may be similarly affected by a second RC time constant $\tau 2$ equal to the product of the total resistance R2 (the resistance of replica fuse 96' and, optionally, additional resistance 162) and the total capacitance C2 (the capacitance of modified write bit lines 158 or 160 and, optionally, additional capacitance 162). By selectively choosing the R2 resistance and/or the C2 capacitance, the first RC time constant $\tau 1$ can be made substantially equal to the second RC time constant $\tau 2$ and thus support substantially simultaneous presentation of write bit line data to both the reset circuit 64 and the memory cell 10.

Figure 6:
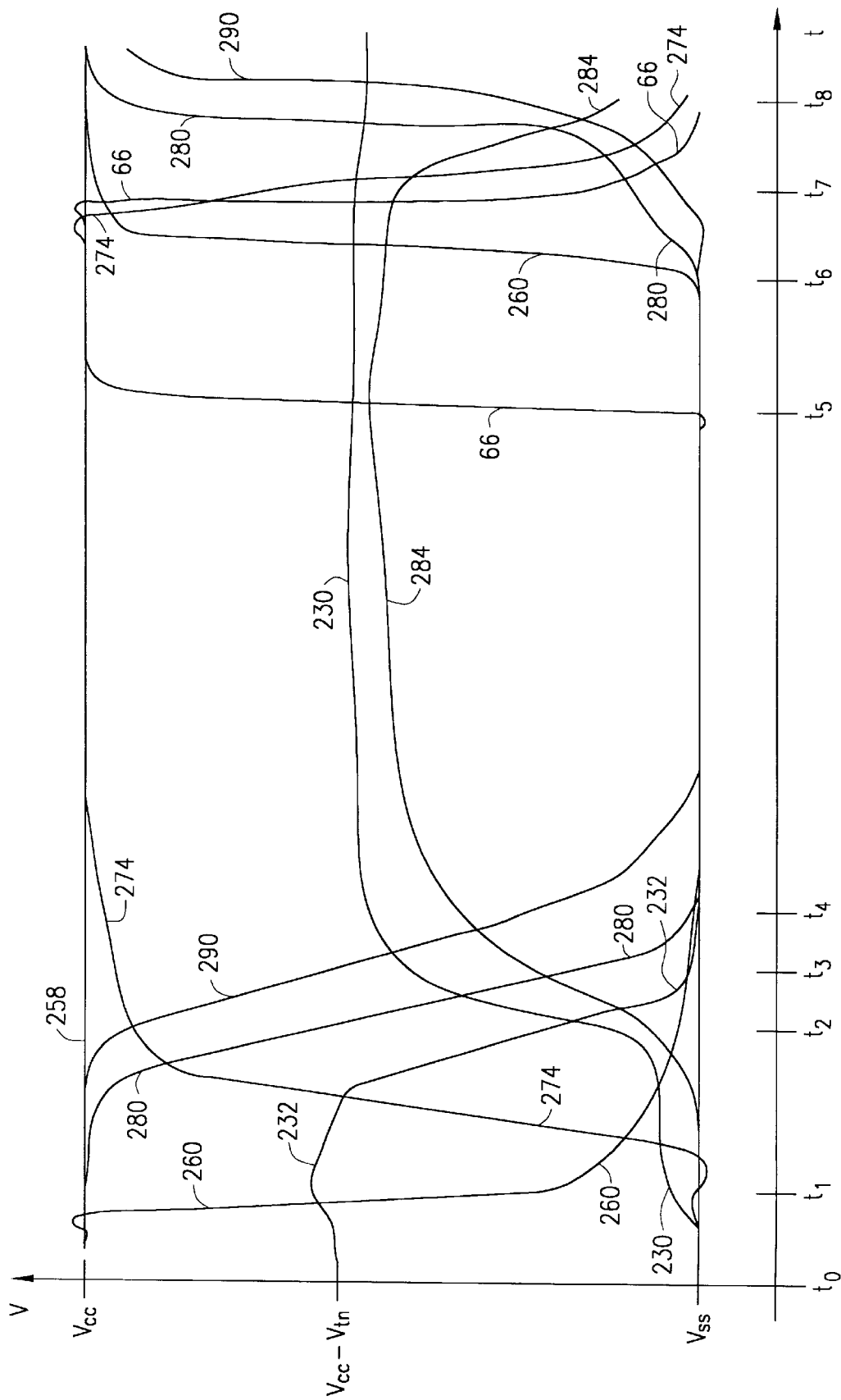
FIG. 6 is timing diagram illustrating operation of the memory of FIG. 4.

Reference is now made to FIGS. 1, 3 and 4, as well as to FIG. 6 wherein there is shown a timing diagram illustrating operation of the memory of FIG. 4. At the start of a write operation (at time t0), write bit true (WBT) and write bit complement (WBC) data comprising signals 258 and 260 (on lines 58 and 60), respectively, are high (Vcc). This is indicative of an operational state wherein data is not being written into the memory. The output of the NAND gate 74, represented by signal 274, is at logic level low (Vss) which drives the true and complement nodes 80 and 84 of the dummy memory cell 10' as represented by signals 280 and 284 to high and low logic levels, respectively. The output of NAND gate 74 (comprising signal 274) remains at logic level low for so long as the write bit true signal 258 and write bit complement signal 260 both maintain a logic level high indicative of the operational state wherein data is not being written into the memory. The high and low, respectively, logic levels of the signals 280 and 284 remain the same at all times during circuit operation except when the write operation itself is being performed. The logic level low output of the NAND gate 74 and logic level low dummy memory cell complement signal 284 further produce a logic level high write complete signal 290 (output from the write simulation logic 70 at node 90) and a logic level low reset signal 66 (output from the delay circuit 72).

In this example write operation, the data to be written into the memory cell is a logic level high (i.e., a 1). Thus, when the write data is presented by the write driver 52 (at time t1), the write bit complement signal 260 falls to a logic level low and the write bit true signal 258 remains high. The true and complement values of the data to be written (signals 258 and 260) are presented to the bit lines 20 and 22 of the memory cell 10 through the column select transistors 54 and 56, respectively, and the fuses 96. As logic level high data is being written into the memory cell 10, the true and complement nodes 30 and 32 of the memory cell, represented by signals 230 and 232, are driven to high and low logic levels, respectively (at time t2).

Simultaneous with the presentation to the memory cell bit lines 20 and 22, the true and complement values of the data to be written are also presented to the NAND gate 74 through the fuse structure mimic circuit 152. A comparable write bit line data presentation delay to that introduced by the fuses 96 with respect to the memory cell 10 is accordingly also introduced by the fuse structure mimic circuit 152 with respect to write data presentation to the reset circuit 64. The output signal 274 from the NAND gate 74 goes high in response to signal 260 going low (time t1) and thus signals detection of the occurrence of a write operation. When NAND gate 74 output signal 274 goes to logic level high, this causes a flipping of the data in the dummy memory cell 10', by driving its true and complement nodes 80 and 84 as represented by signals 280 and 284 to the opposite low and high logic levels, respectively (at time t3). This data flipping action in the dummy memory cell 10' simulates the occurrence of the actual write operation (compare, signals 230 and 232) which is substantially simultaneously occurring in the memory cell 10. The logic level high signal 274 output from the NAND gate 74 and logic level high dummy memory cell complement signal 284 further drive the write complete signal 290 output from the write simulation logic 70 at node 90 to logic level low (at time t4), and thereafter further drive the reset signal 66 output from the delay circuit 72 to logic level high (at time t5).

Responsive to the logic level high pulsing of the reset signal 66, operations of the addressing and accessing circuits within the memory are immediately terminated. These addressing and accessing circuits are further reset by the pulsed signal in preparation for the start of a next write operation. The reset signal 66 pulse output from the reset circuit accordingly provides for an internal, self-timed termination of the memory write operation.

Following termination of the write operation and resetting of the addressing and accessing circuits, the write bit true line 58 and the write bit complement line 60 are both returned to logic level high (time t6). At this point, the delay circuit 74 may operate to truncate the pulse application of the reset signal 66 and thus drive the reset signal 66 back to logic level low (time t7). The return of write bit true line 58 and the write bit complement line 60 to logic level high further drives the signal 274 output from the NAND gate 74 back to normally logic level low (also at time t7). When NAND gate 74 output signal 274 goes to logic level low, this causes a re-flipping of the data in the dummy memory cell 10' back to its normal state by driving its true and complement nodes 80 and 84, as represented by signals 280 and 284, to the opposite high and low logic levels, respectively (also at time t7). The logic level low signal 274 output from the NAND gate 74 and logic level low dummy memory cell complement signal 284 further drive the write complete signal 290 output from the write simulation logic back to logic level high (at time t8).

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A memory, comprising:

a write driver generating data on a pair of write bit lines;

a memory cell having a pair of bit lines, wherein each memory cell bit line is selectively connected to a corresponding one of the write bit lines through a first resistive element;

a reset circuit connected to the write bit lines and operable to generate a reset signal for resetting the memory in preparation for a next memory operation in response to a detected write bit line data transitions indicative of the occurrence of a write operation to the memory cell; and a delay mimic circuit connected to the write bit lines between the write driver and the reset circuit, the delay mimic circuit introducing a delaying effect on the passage of write bit line data prior to processing by the reset circuit that substantially corresponds to a delaying effect on the passage of write bit line data due to driving the memory cell bit lines through the first resistive element.

2. The memory as in claim 1 wherein the first resistive element comprises a selectively blowable fuse and the delaying effect introduced by the delay mimic circuit substantially corresponds to the delaying effect on the passage of write bit line data due to driving the memory cell bit lines through the selectively blowable fuse.

3. The memory as in claim 2 wherein the delay mimic circuit comprises a fuse structure mimic circuit.

4. The memory as in claim 3 wherein the fuse structure mimic circuit comprises a replica, connected in series to each of the write bit lines, of the memory cell bit line connected selectively blowable fuse.

5. The memory as in claim 3 wherein the fuse structure mimic circuit comprises:

a replica, connected in series to each of the write bit lines, of the memory cell bit line connected selectively blowable fuse; and a second resistive element series connected to the replica.

6. The memory as in claim 5 wherein the second resistive element comprises one or more series connected replicas of the memory cell bit line connected selectively blowable fuse.

7. The memory as in claim 3 wherein the fuse structure mimic circuit comprises:

a replica, connected in series to each of the write bit lines, of the memory cell bit line connected selectively blowable fuse; and a capacitive element shunt connected to each of the write bit lines.

8. The memory as in claim 7 wherein the capacitive element comprises a shunt connected metal oxide semiconductor capacitor.

9. The memory as in claim 7 wherein the capacitive element comprises a shunt connected diffusion capacitor.

10. The memory as in claim 2, wherein:

the selectively blowable fuse comprises a selectively blowable polysilicon fuse.

11. A memory, comprising:

a write driver generating data on a pair of write bit lines;

a memory cell having a pair of bit lines exhibiting a certain capacitance C1, wherein each memory cell bit line is selectively connected to a corresponding one of the write bit lines through a first resistive element exhibiting a certain resistance R1 that introduces a delaying effect on the passage of write bit line data to the memory cell defined by a first RC time constant $\tau 1$ equal to the product of R1 and C1;

a delay mimic circuit connected to the write bit lines; and a reset circuit connected to the delay mimic circuit through a pair of modified write bit lines exhibiting a certain capacitance C2, the reset circuit operable to generate a reset signal for resetting the memory in preparation for a next memory operation in response to the occurrence of a write operation to the memory cell;

wherein the delay mimic circuit connected to the write bit lines, the delay mimic circuit including a second resistive element have a certain resistance R2 that introduces a delaying effect on the passage of write bit line data to the reset circuit defined by a second RC time constant $\tau 2$ equal to the product of R2 and C2; and wherein the certain resistance R2 is selectively chosen to make the second RC time constant $\tau 2$ substantially equal to the first RC time constant $\tau 1$ to equalize any introduced delaying effects in the presentation of the write bit line data to the memory cell and reset circuit.

12. The memory as in claim 10 wherein:

the first resistive element comprises a selectively blowable fuse; and the second resistive element comprises a replica, connected in series to each of the write bit lines, of the memory cell bit line connected selectively blowable fuse.

13. The memory as in claim 12, wherein:

the selectively blowable fuse is a selectively blowable polysilicon fuse.

14. The memory as in claim 11 wherein:

the first resistive element comprises a selectively blowable fuse; and the second resistive element comprises:
 a replica, connected in series to each of the write bit lines, of the memory cell bit line connected selectively blowable fuse; and
 a third resistive element series connected to the replica.

15. The memory as in claim 14, wherein:

the third resistive element comprises one or more series connected replicas of the memory cell bit line connected selectively blowable fuse.

16. The memory as in claim 11 wherein:

the first resistive element comprises a selectively blowable fuse; and the second resistive element comprises:
 a replica, connected in series to each of the write bit lines, of the memory cell bit line connected selectively blowable fuse; and
 a capacitive element shunt connected to each of the write bit lines.

17. The memory as in claim 16 wherein the capacitive element comprises a shunt connected metal oxide semiconductor capacitor.

18. The memory as in claim 16 wherein the capacitive element comprises a shunt connected diffusion capacitor.

19. A memory, comprising:

a write driver generating data on a pair of write bit lines;

a memory cell having a pair of bit lines, wherein each memory cell bit line is selectively connected to a corresponding one of the write bit lines through a resistive element introducing a delaying effect on the passage of write bit line data to the memory cell;

a reset circuit connected to the write bit lines and operable to generate a reset signal for resetting the memory in preparation for a next memory operation in response to a detected write bit line data transitions indicative of the occurrence of a write operation to the memory cell; and a delay mimic circuit connected to the write bit lines between the write driver and the reset circuit, the delay mimic circuit introducing a corresponding delaying effect on the passage of write bit line data prior to processing by the reset circuit in order to facilitate substantially simultaneous presentation of the write bit line data to both the reset circuit and the memory cell.

20. The memory as in claim 19, wherein:

the resistive element comprises a selectively blowable fuse; and the delay mimic circuit includes a replica, connected in series to each of the write bit lines, of the memory cell bit line connected selectively blowable fuse.

21. The memory as in claim 19, wherein:

the resistive element comprises a selectively blowable fuse; and the delay mimic circuit comprises:
 a replica, connected in series to each of the write bit lines, of the memory cell bit line connected selectively blowable fuse; and
 an additional impedance connected to the replica.

22. The memory as in claim 21, wherein the additional impedance comprises one or more series connected replicas of the memory cell bit line connected selectively blowable fuse.

23. The memory as in claim 21, wherein:

the additional impedance comprises a capacitive element shunt connected to each of the write bit lines.

24. The memory of claim 19, wherein:

the resistive element is a selectively blowable polysilicon fuse.

* * * * *